(12) United States Patent
Kawanago et al.

(10) Patent No.: US 11,798,950 B2
(45) Date of Patent: Oct. 24, 2023

(54) DISPLAY DEVICE

(71) Applicant: Japan Display Inc., Tokyo (JP)

(72) Inventors: Hiroshi Kawanago, Tokyo (JP); Kazufumi Watabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 82 days.

(21) Appl. No.: 17/119,077

(22) Filed: Dec. 11, 2020

(65) Prior Publication Data

US 2021/0098502 A1 Apr. 1, 2021

Related U.S. Application Data

(63) Continuation of application No. PCT/JP2019/022323, filed on Jun. 5, 2019.

(30) Foreign Application Priority Data

Jun. 15, 2018 (JP) ................ 2018-114243

(51) Int. Cl.
*H01L 27/12* (2006.01)
*H10K 59/12* (2023.01)
*H10K 77/10* (2023.01)
*H10K 102/00* (2023.01)
*H10K 50/00* (2023.01)
*G02F 1/1333* (2006.01)
(Continued)

(52) U.S. Cl.
CPC .... *H01L 27/1218* (2013.01); *G02F 1/133305* (2013.01); *G02F 2202/28* (2013.01); *H01L 27/1262* (2013.01); *H10K 59/12* (2023.02); *H10K 59/1201* (2023.02); *H10K 71/80* (2023.02); *H10K 77/111* (2023.02)

(58) Field of Classification Search
CPC ............. H01L 27/1218; H01L 27/1262; H01L 27/3244; H01L 51/0097; H01L 2227/326; G02F 1/133305; G02F 2202/28
See application file for complete search history.

(56) References Cited

U.S. PATENT DOCUMENTS 9,773,853 B2 * 9/2017 Tao ................ H01L 51/5253
2007/0054440 A1 * 3/2007 Hu ................ H01L 51/0097
438/142

(Continued)

FOREIGN PATENT DOCUMENTS

JP 2010-54543 A 3/2010
JP 2013-127905 A 6/2013

OTHER PUBLICATIONS

International Search Report dated Aug. 20, 2019 in PCT/JP2019/022323 filed Jun. 5, 2019, 1 page.

*Primary Examiner* — Mohsen Ahmadi
(74) *Attorney, Agent, or Firm* — Maier & Maier, PLLC

(57) ABSTRACT

The purpose of the present invention is to prevent forming of soot like black substance on the back of the TFT substrate of resin during laser ablation to separate the glass substrate from the TFT substrate. The present invention takes the following structure to counter measure the above problem. A display device having pixels formed on a first surface of the resin substrate including: a first layer, formed from nitride, being formed on a second surface of the resin substrate, the second surface being an opposite surface to the first surface, in which a second layer, which is a separation layer, is formed on the first layer.

4 Claims, 21 Drawing Sheets

(51) Int. Cl.
*G09F 9/30* (2006.01)
*H10K 71/80* (2023.01)

(56) References Cited

U.S. PATENT DOCUMENTS

| | | | |
|---|---|---|---|
| 2008/0225214 A1* | 9/2008 | Kinoshita | G02F 1/133305 |
| | | | 349/122 |
| 2010/0167031 A1* | 7/2010 | Leu | B32B 27/08 |
| | | | 428/212 |
| 2017/0117498 A1* | 4/2017 | Takechi | H01L 27/1218 |
| 2018/0040644 A1* | 2/2018 | Ishii | G02F 1/1303 |
| 2018/0040645 A1* | 2/2018 | Ishii | G02F 1/1303 |
| 2018/0114905 A1* | 4/2018 | Yu | H01L 51/0097 |
| 2018/0122634 A1* | 5/2018 | Bu | H01L 21/0245 |
| 2019/0088788 A1* | 3/2019 | Ban | H01L 29/42384 |
| 2019/0115232 A1* | 4/2019 | Zhang | B23K 26/14 |
| 2019/0172843 A1* | 6/2019 | Yoshida | H01L 29/78648 |

* cited by examiner

DISPLAY DEVICE

The present application is a continuation application of International Application No. PCT/JP2019/022323, filed Jun. 5, 2019, which claims priority to Japanese Patent Application No. 2018-114243, filed. Jun. 15, 2018. The contents of these applications are incorporated herein by reference in their entirety.

BACKGROUND OF THE INVENTION

(1) Field of the Invention

The present invention relates to a display device, specifically to a flexible display device in which the substrates can be curved, and manufacturing method for those display devices.

(2) Description of the Related Art

The organic EL display device and the liquid crystal display device can be used in curved state by making those devices thin. Further, those display devices can be made flexible by using the resin substrates formed from e.g. polyimide.

Many layers as conductive layers, insulating layers, protective layers, electrode layers and so forth are formed on the resin substrate. Light transmittance becomes a problem when many layers are formed. Patent document 1 discloses NDF (Neutral Density Filter), in which the metal layer and the dielectric layer are laminated alternately. Even in a case of metal layer, the transmittance of the visible light can be increased according to a thickness of the layer becoming thinner. Patent document 2 discloses a change in transmittances of light when aluminum (Al) film is made thin.

Prior Technical Document

Patent Document

Patent document 1: Japanese patent application laid open No. 2010-54543
Patent document 2: Japanese patent application laid open No. 2013-127905

SUMMARY OF THE INVENTION

A thickness of the resin substrate used in the flexible display device is 10 to 20 microns. Such a thin substrate is formed such that e.g. liquid resin is coated on a glass substrate, then it is baked to become a thin resin substrate. The resin substrate passes through the manufacturing process with the glass substrate until the display panel is completed; after that, the glass substrate is removed from the resin substrate, then, the flexible display device is realized.

Such a process has following problems. Firstly, the resin substrate must securely be adhered to the glass substrate during the manufacturing process. Secondly, after the display device is completed, the glass substrate must be removed securely form the resin substrate.

Generally, removing the glass substrate from the resin substrate is performed by laser ablation, in which the interface between the glass substrate and the resin substrate is irradiated with the laser beam. During this laser ablation, there is a chance that the polyimide is deteriorated and changes to the soot like black substance at the interface with the glass substrate.

The liquid crystal display device forms pictures by modulating the light from the back light in each of the pixels; however, when such a black substance is formed on the resin substrate, which is the TFT substrate, the light from the back light is attenuated, and consequently there arises a chance that non-uniformity in the picture is generated according to the pattern of the black substance.

On the other hand, even in the organic EL display device, if such a soot like substance exists at the bottom of the TFT substrate, the commercial value of the display device is decreased.

The purpose of the present invention is to prevent generation of soot like black substance when the glass substrate is separated from the resin substrate; and thus, to realize the display device that can display high quality images.

The present invention solves the above explained problems; the concrete measures are as follows.

(1) A display device having pixels formed on a first surface of the resin substrate including: a first layer, formed from nitride, being formed on a second surface of the resin substrate, the second surface being an opposite surface to the first surface, in which a second layer, which is a separation layer, is formed on the first layer.

(2) A display device having pixels formed on a first surface of the resin substrate including: a first layer, including an AlO layer, being formed on a second surface of the resin substrate, the second surface being an opposite surface to the first surface, in which a second layer including a nitride layer is formed on the first layer, a third layer including a silicon layer is formed on the second layer.

(3) A display device having pixels formed on a first surface of the resin substrate including: a first layer, including an AlO layer, being formed on a second surface of the resin substrate, the second surface being an opposite surface to the first surface, in which a second layer including a nitride layer is formed on the first layer, a third layer including a silicon oxide layer is formed on the second layer.

(4) A display device having pixels formed on a first surface of the resin substrate including: a first layer, including an AlO layer, being formed on a second surface of the resin substrate, the second surface being an opposite surface to the first surface, in which a second layer including a nitride layer is formed on the first layer, a third layer including a metal layer is formed on the second layer.

DETAILED DESCRIPTION OF THE PREFERRED EMBODIMENTS

The present invention is explained by the following embodiments in detail.

Embodiment 1

Figure 1:
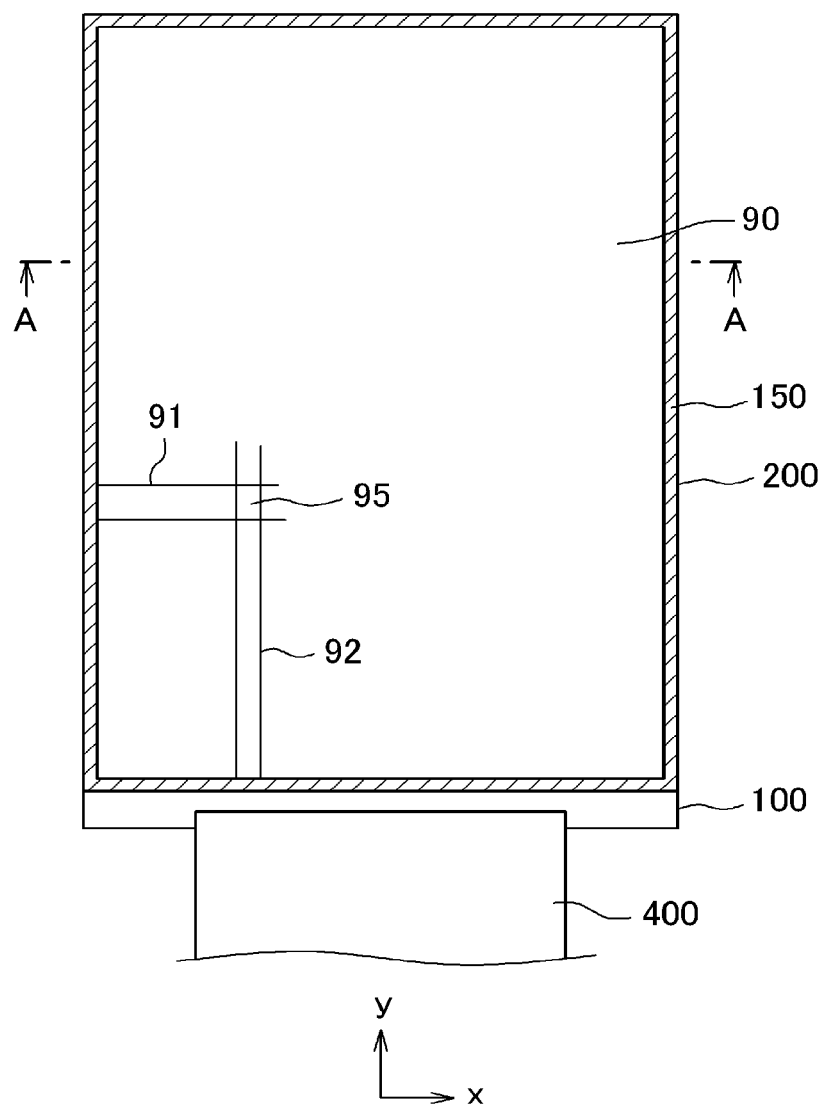
FIG. 1 is a plan view of the liquid crystal display device.

FIG. 1 is a plan view of the liquid crystal display device, in which the present invention is applied. The present invention can be used in a display device, which is bendable flexibly. Therefore, the TFT substrate 100, on which the scan signal lines, the video signal lines, the pixels, and so forth are formed, is made of the resin substrate. Among resins, polyimide has excellent characteristics for the substrate of the display device because of its heat resistance, mechanical strength, and so forth. Therefore, the polyimide is premised to be used for the TFT substrate 100 herein after; however, the present invention is applicable even when the TFT substrate 100 is made of other resins.

FIG. 1 is a plan view of the liquid crystal display device. In FIG. 1, the TFT substrate 100 and the counter substrate 200 are mutually adhered by the sealant 150; the liquid crystal is sandwiched between the TFT substrate 100 and the counter substrate 200, and is sealed inside of the sealant 150.

The display area 90 is made where the TFT substrate 100 and the counter substrate 200 overlap. In the display area 90, the scan signal lines 91 extend in lateral direction (x direction) and are arranged in longitudinal direction (y direction). The video signal lines 92 extend in longitudinal direction and are arranged in lateral direction. The pixel 95 is formed in the area surrounded by the scan signal lines 91 and the video signal lines 92. The TFT substrate 100 is made larger than the counter substrate 200; the area where the TFT substrate 100 does not overlap with the counter substrate 200 is the terminal area. The flexible wiring substrate 400 is connected to the terminal area to supply powers and signals to the liquid crystal display device.

Figure 2:
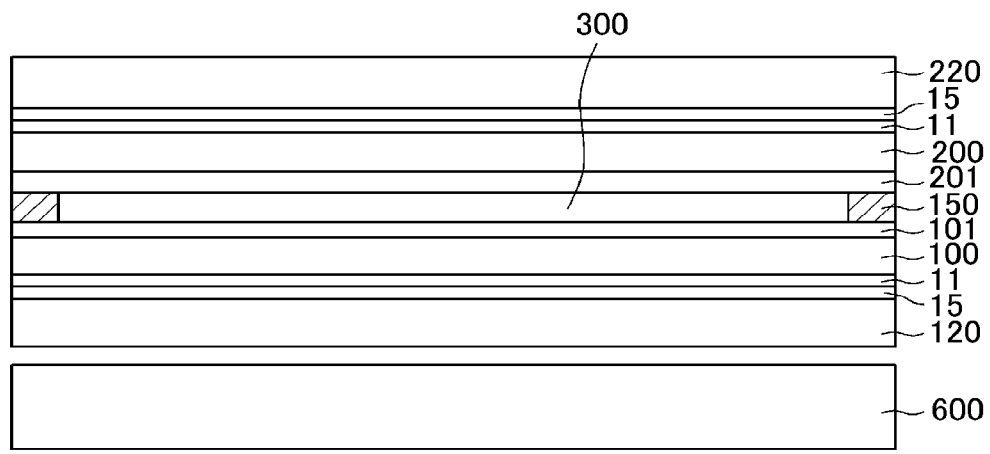
FIG. 2 is a cross sectional view along the line A-A of FIG. 1.

FIG. 2 is a cross sectional view of FIG. 1 along the line A-A. In FIG. 2, the TFT wiring layer 101 is formed on the TFT substrate 100, which is made of polyimide; the color filter layer 201 is formed on the counter substrate 200, which is made of polyimide. The TFT substrate 100 and the counter substrate 200 are mutually adhered by the sealant 150; the liquid crystal 300 is sealed inside the sealant 150.

In FIG. 2, the adhesion layer 11 and the separation layer 15 that are explained in embodiment 1 are formed on the outside surfaces of the TFT substrate 100 and the counter substrate 200. To the surface on the outside of the adhesion layer 11 and the separation layer 15 of the counter substrate 200, the upper polarizer 220 is adhered; to the surface on the outside of the adhesion layer 11 and the separation layer 15 of the TFT substrate 100, the lower polarizer 120 is adhered.

In FIG. 2, the back light 600 is disposed at the back of the lower polarizer 120. If a sheet type light source, formed by e.g. organic EL light, is used for the back light 600, the liquid crystal display device can maintain flexibility as a whole.

Figure 3:
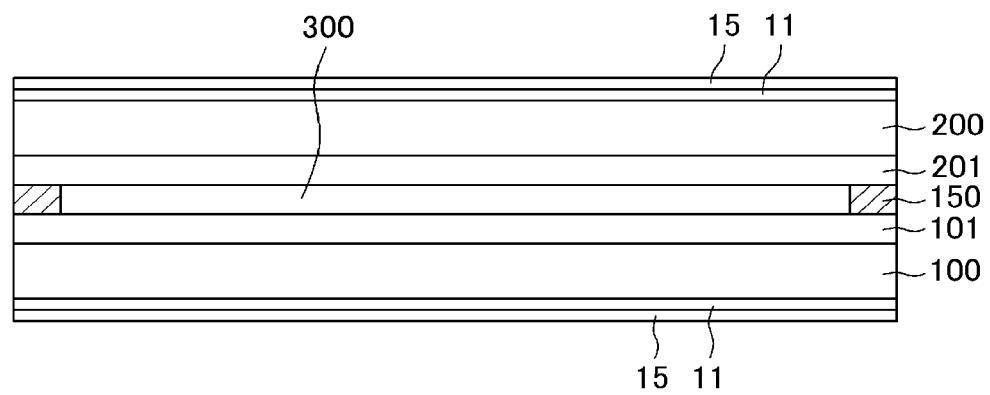
FIG. 3 is a cross sectional view of the liquid crystal display device according to the present invention.

FIG. 3 is a cross sectional view of the liquid crystal display panel, in which the upper polarizing plate 220 and the lower polarizing plate 120 are removed. In FIG. 3, the adhesion layer 11, made of nitride such as SiN, TiN or AlN in a thickness of 10 to 500 nm, favorably 10 to 100 nm, is formed on the outer surface of the TFT substrate 100 and the outer surface of the counter substrate 200.

One role of the adhesion layer 11 is to block the gases, generated from the glass substrate, from reaching the polyimide substrate 100 during the laser ablation. Another role is to maintain adhesiveness between the polyimide substrate 100 and the multilayer film. The separation layer 15 is formed on the adhesion layer 11. This separation layer 15 can be the poly-Si layer, which is transformed from the a-Si layer by irradiation of excimer laser. A thickness of the separation layer 15 is e.g. 10 to 50 nm. The volume of the layer shrinks when the a-Si changes to the poly-Si, consequently, a stress is generated. The TFT substrate 100 and the glass substrate 500 are mutually separated due to this stress. The a-Si can be substituted by other substance that reveals such a volume compaction.

Figure 4:
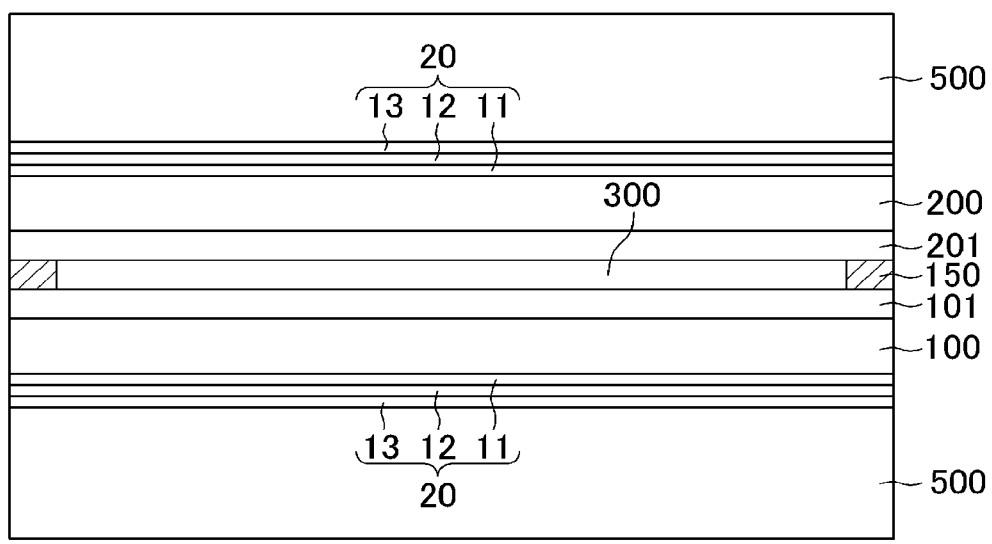
FIG. 4 is a cross sectional view of the TFT substrate and the glass substrate before being separated from each other.

The following process is for manufacturing the liquid crystal display panel of FIG. 3. The TFT circuit layer 101 is formed on the TFT substrate 100, which is formed on the glass substrate 500 as depicted in FIG. 4. The TFT circuit layer 101 includes the scan signal lines, the video signal lines, the pixels, the common electrodes, and so forth. The color filter layer 201 is formed on the counter substrate 200, which is formed on the glass substrate 500. The color filter layer 201 includes the color filter, the black matrix, the overcoat and so forth. The liquid crystal 300 is injected in the counter substrate of this stage; after that, the TFT substrate 100 and the counter substrate 200 are mutually adhered by the sealant 150 to seal the liquid crystal 300 inside.

In the state of FIG. 4, the multilayer film 20 including the adhesion layer 11, the a-Si layer 12, and the gas block layer 13, is formed between the TFT substrate 100 and the glass substrate 500 and between the counter substrate 200 and the glass substrate 500. The gas block layer 13 is formed from nitride of e.g. SiN, TiN, or AlN; a thickness of the gas block layer 13 is 100 to 500 nm.

Figure 5:
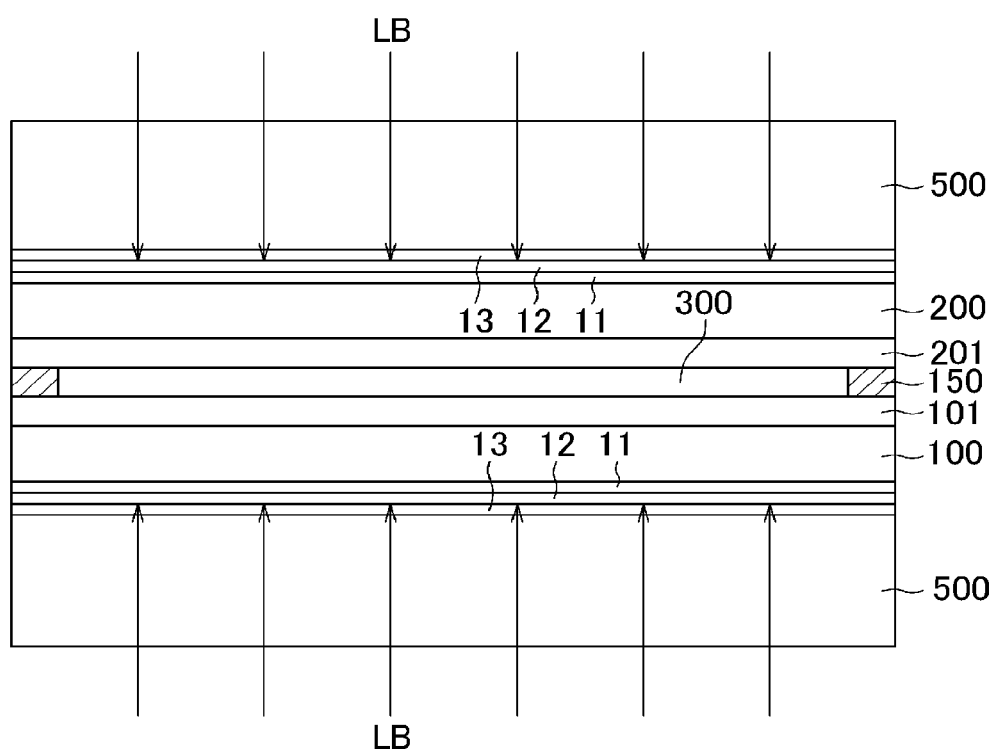
FIG. 5 is a cross sectional view depicting a state in which laser beam irradiation is performed to separate the TFT substrate from the glass substrate.

After that, as depicted in FIG. 5, the a-Si layer 12 is irradiated with the excimer laser LB to be converted to the poly-Si layer 15. The layer structure of FIG. 5 is the same as that of FIG. 4. When the a-Si layer 12 is irradiated with the excimer laser LB, the a-Si layer 12 melts at first, and then changes to the poly-Si 15. In this timing, the volume of the a-Si layer 12 shrinks and a stress is generated; this stress separates the TFT substrate 100 made of resin from the glass substrate 500.

Figure 6:
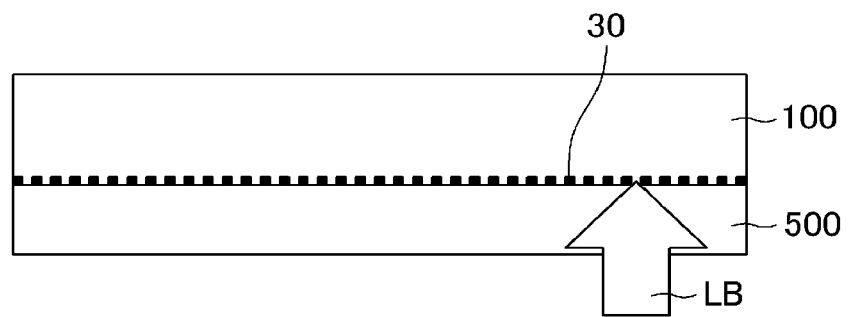
FIG. 6 is a cross sectional view that shows a problem when the interface between the glass substrate and the polyimide substrate is irradiated with the laser beam when the present invention is not used.

FIG. 6 is a cross sectional view that shows the problem when the present invention is not applied, namely, the polyimide substrate 100 is formed directly on the glass substrate 500. In FIG. 6, the interface between the glass substrate 500 and the polyimide substrate 100 is irradiated with the laser beam LB for laser ablation; the interface between the glass substrate 500 and the polyimide substrate 100 is heated by the laser beam LB. The glass is formed from several oxides such as silicon oxides, in addition, moisture and organic substances exist between them; thus, the gases such as oxygen and hydrogen are generated when the glass substrate 500 is heated. The polyimide near the interface with the glass substrate 500 is oxidized by those gases; consequently, the soot like black substance 30 is generated. Such a soot like black substance 30 decreases the transmittance of the polyimide substrate 100, therefore, brightness of the screen is decreased.

Figure 7:
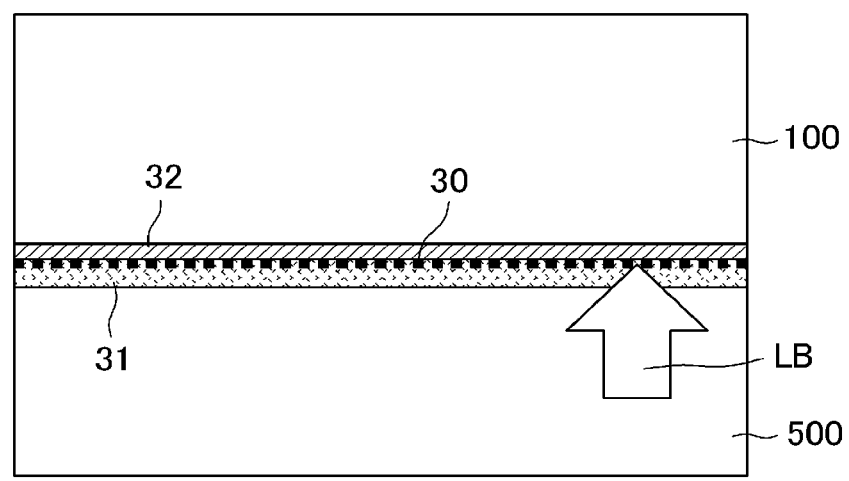
FIG. 7 is a detailed cross sectional view that shows a reason why the problem occurs when the interface between the glass substrate and the polyimide substrate is irradiated with the laser beam when the present invention is not used.

FIG. 7 is a cross sectional view that shows the mechanism explained above. In FIG. 7, the interface between the glass substrate 500 and the polyimide substrate 100 is irradiated with the laser LB; then, the interface between the glass substrate 500 and the polyimide substrate 100 is heated, consequently, gases are generated from the interface between the glass substrate 500 and the polyimide substrate 100. The gases are designated by 31 in FIG. 7. On the other hand, the polyimide substrate 100 is heated at the interface and is in high temperature, namely, the polyimide at this portion is activated and easily oxidized. The region of high temperature in polyimide substrate 100 is designated by 32 in FIG. 7. Thus, the soot like black substance 30 is generated at the interface between the glass substrate 500 and the TFT substrate 100.

Figure 8:
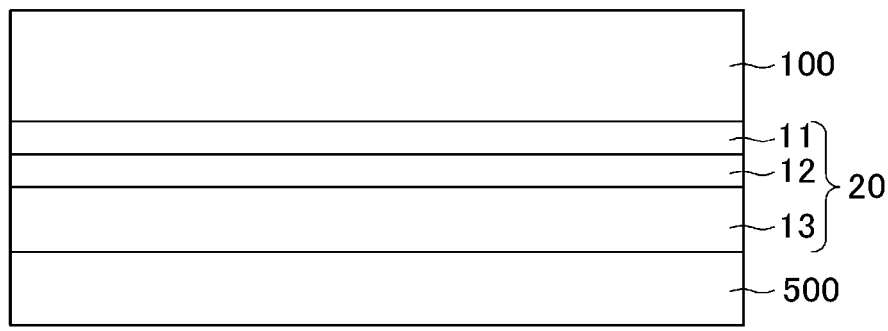
FIG. 8 is a cross sectional view that shows an interface between the glass substrate and the polyimide substrate according to the present invention.

Generation of the black substance 30 can be avoided if the gases from the glass substrate 500 do not exist at the portion where polyimide substrate 100 is heated. FIG. 8 is a cross sectional view of embodiment 1 according to the present invention that enables this function. In FIG. 8, the multilayer film 20 of three layers is formed between the polyimide substrate 100 and the glass substrate 500. The multilayer film 20 includes the adhesion layer 11, the a-Si layer 12 and the gas block layer 13 from the side of the polyimide substrate 100. The adhesion layer 11 is formed form nitride such as SiN, TiN, and AlN; the thickness is 10 to 500 nm, preferably, 10 to 100 nm. Some nitrides are colored when layers become thicker; however, SiN is not colored, therefore, SiN is specifically adaptable to the adhesion layer 11.

The a-Si layer 12 absorbs the excimer laser LB, which is used for laser ablation, and converts it to heat energy; a thickness of the a-Si layer 12 is e.g. 10 to 50 nm. The a-Si layer 12 has a major role to separate the polyimide substrate 100 from the glass substrate 500; however, since the a-Si layer 12 does not have a good adhesiveness with the polyimide substrate 100, the adhesion layer 11 made of nitride is formed between the a-Si layer 12 and the polyimide substrate 100.

The gas block layer 13 is formed between the a-Si layer 12 and the glass substrate 500 to prevent the gases, generated in the glass substrate 500, from reaching the polyimide substrate 100. The gas block layer 13 is formed from nitride such as SiN, TiN, and AlN; a thickness of the gas block layer 13 is 100 to 500 nm. Some nitrides are colored when layers become thicker; however, since SiN is not colored, SiN is specifically adaptable to the gas block layer 13.

Figure 9:
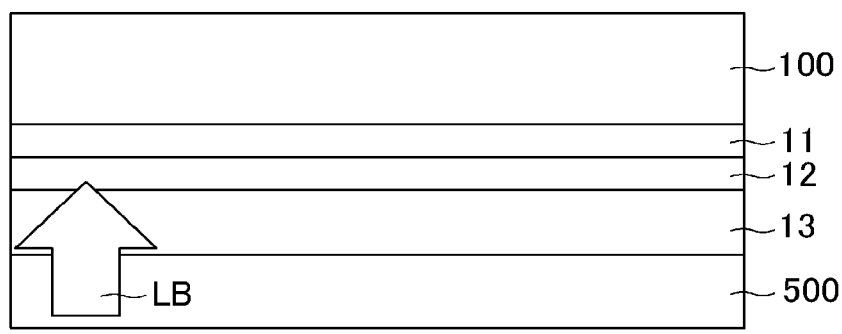
FIG. 9 is a cross sectional view depicting a state in which the a-Si layer is irradiated with the excimer laser according to the present invention.

FIG. 9 is a cross sectional view depicting a state in which the interface between the polyimide substrate 100 and the glass substrate 500 is irradiated with the laser beam LB for the laser ablation, concretely in the a-Si layer 12. The excimer laser LB has peaks at wavelength of 308 and 355 nm; the a-Si layer 12 absorbs almost 100% of the laser of those wave lengths. Due to the energy of the laser beam, the a-Si layer 12 is heated to high temperature, then, the a-Si layer 12 melts.

The heat, generated in the a-Si layer 12, raises the temperature of the adhesion layer 11, the polyimide substrate 100 in the vicinity of the interface, the gas block layer 13, and the glass substrate 500 in the vicinity of the interface. The glass substrate 500 in the vicinity of the interface is heated and emits gases such as oxygen and hydrogen; those gases, however, do not reach the polyimide substrate 100 since those gases are blocked by the gas block layer 13. Therefore, oxidization of the polyimide substrate 100 by oxygen, hydrogen, and so forth generated in the glass substrate 100 can be avoided; and thus, generation of the black substance 30 is prevented.

By the way, the gas block layer 13 is made thicker than the a-Si layer 12. The thicker blocking layer 13 increases the blocking effect against gases from the glass substrate 500; at the same time, it prevents the heat, generated in the a-Si layer 12, from conducting to the glass substrate 500.

The adhesion layer 11 is made thicker than the a-Si layer 12. The heat generated in the a-Si layer 12 is prevented from conducting to the polyimide substrate 100 by making the adhesion layer 11 thicker. When the polyimide substrate 100 becomes high temperature, the polyimide is deteriorated and transmittance of the light can be changed; this problem is avoided by making the adhesion layer 11 thicker.

Figure 10:
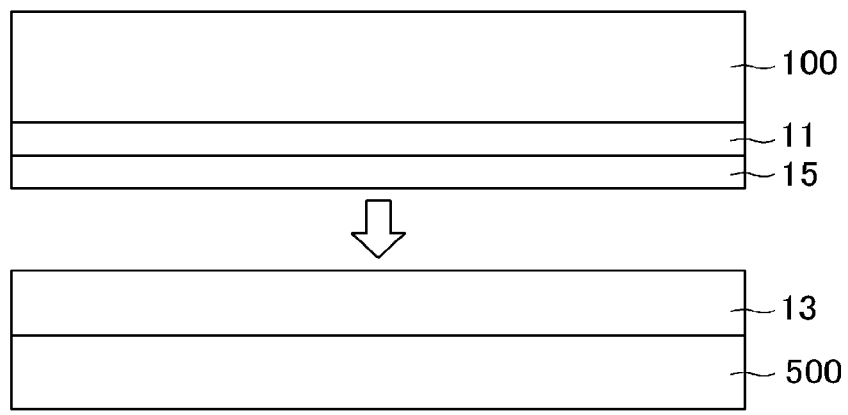
FIG. 10 is a cross sectional view depicting a state in which the glass substrate and the polyimide substrate are separated according to the present invention.

FIG. 10 is a cross sectional view depicting a state in which the polyimide substrate 100 and the glass substrate 500 are mutually separated by laser ablation. When the a-Si layer 12 is irradiated with the excimer laser LB, the a-Si layer 12 melts; however, since the laser irradiation is performed only a short time, the a-Si layer 12 is converted to the poly-Si layer 15 after irradiation of the laser. The volume of the a-Si layer 12 shrinks when it is converted to the poly-Si layer 15; consequently, a stress is generated between the gas block layer 13 and the poly-Si layer 15; thus, separation occurs at the interface between the poly-Si layer 15 and the gas block layer 13 by this stress. Namely, the a-Si layer 12 melts by the excimer laser and crystalizes to be the poly-Si layer 15; a shrink of the volume occurs when the a-Si changes to the poly-Si and the stress is generated; this stress at the interface separates the glass substrate 500 from the polyimide substrate 100.

As described above, according to embodiment 1, since gases from the glass substrate 500 are prevented from reaching the polyimide substrate 100 during the laser ablation, a generation of the black substance 30 can be avoided. In addition, the polyimide substrate 100 in the vicinity of the interface is not excessively heated; thus, deterioration of the polyimide substrate 100 can be avoided.

Embodiment 2

Figure 11:
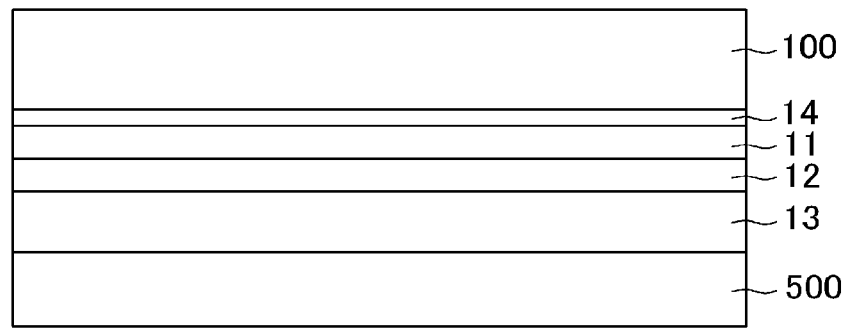
FIG. 11 is a cross sectional view of interface between the glass substrate and the polyimide substrate according to embodiment 2.

FIG. 11 is a cross sectional view of embodiment 2 according to the present invention. FIG. 11 differs from FIG. 8 of embodiment 1 in that the aluminum oxide layer 14 (herein after AlO layer) is formed between the polyimide substrate 100 and the adhesion layer 11, which is formed from nitride. The adhesion layer 11 is formed for adhesion between the a-Si layer 12 and the polyimide substrate 100; however, there is an occasion that the adhesive strength is not enough between the polyimide substrate 100 and the adhesion layer 11. In embodiment 2, the AlO layer 14, which has a high adhesive strength with the polyimide substrate 100, is formed between the adhesion layer 11 and the polyimide substrate 100; thus, adhesive strength between the polyimide substrate 100 and the multilayer film 20 is more stabilized. In other words, two layers of the adhesion layer 11 and the Al layer 14 are used for the adhesion layer in embodiment 2.

Figure 12:
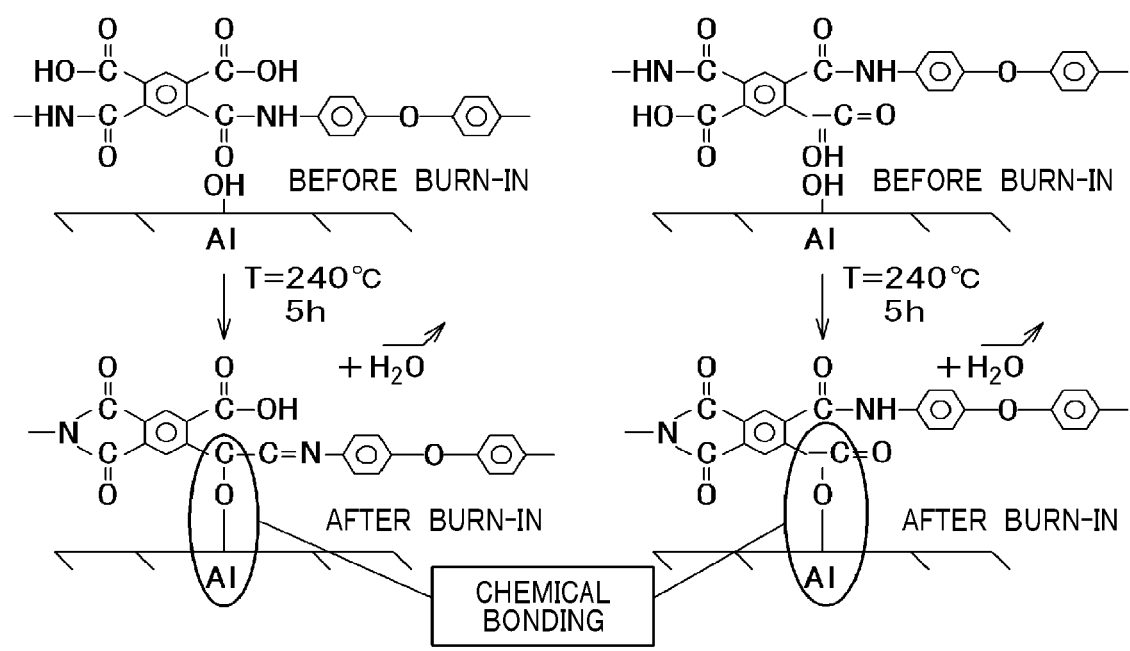
FIG. 12 is an explanatory diagram of adhesion between the polyimide substrate and the AlO substrate.

The reaction shown in FIG. 12 explains how the adhesive strength with the polyimide substrate 100 is improved when AlO layer 14 contacts the polyimide substrate 100. Namely, in an imide bonding process from the polyamic acid to the polyimide, the amide group and the carboxyl group, which originally react in intra molecular reaction, individually reacts with OH group of AlOOH by dehydration reaction.

The adhesion layer 11 has a role to prevent the heat generated in the a-Si layer 12 from conducting to the polyimide substrate 100; however, since the purpose of the AlO layer 14 is to improve adhesive strength between the multilayer film 20 and the polyimide substrate 100, a thickness is made as thin as 5 to 20 nm. Namely, a thickness of the AlO layer 14 is thinner than a thickness of the adhesion layer 11. The AlO layer 14 remains on the polyimide substrate 100 even after the glass substrate 500 is removed; however, the AlO layer 14 does not influence to the transmittance because the AlO layer 14 is transparent. Further the interatomic bonding strength between aluminum and oxygen is strong; thus, oxygen is not separated from aluminum at the temperature where the a-Si melts by the laser heating, e.g. 1000 centigrade, thus, there is almost no chance that the black substance 30 is generated by oxygen from the AlO layer 14.

Figure 13:
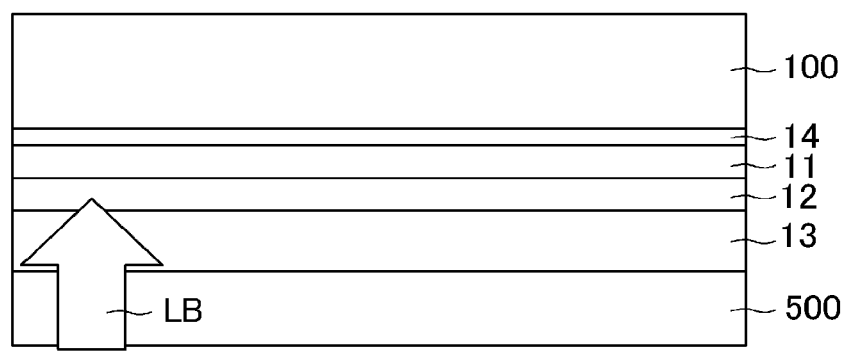
FIG. 13 is a cross sectional view depicting a state in which the a-Si layer is irradiated with the excimer laser according to embodiment 2.

FIG. 13 is a cross sectional view depicting a state in which the a-Si layer 12 of the structure of FIG. 11 is irradiated with the excimer laser LB. FIG. 13 differs from FIG. 9 of embodiment 1 in that the AlO layer 14 exists between the polyimide substrate 100 and the adhesion layer 11. The mechanism of separation of the polyimide substrate 100 from the glass substrate 500 is the same as explained in embodiment 1.

Figure 14:
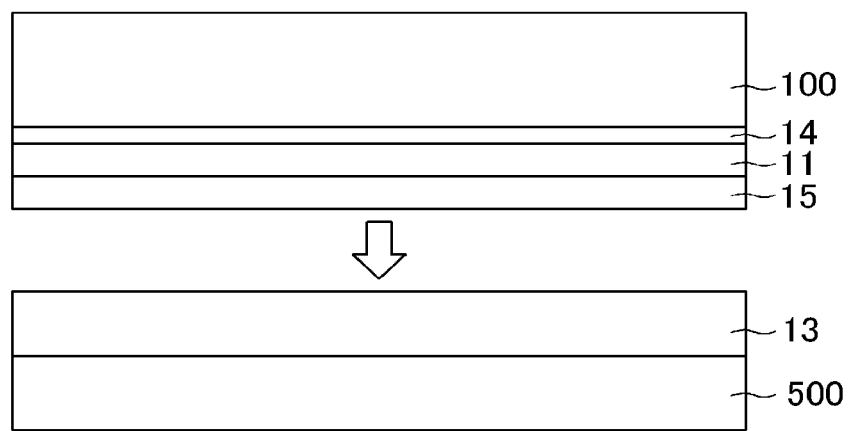
FIG. 14 is a cross sectional view depicting a state in which the glass substrate and the polyimide substrate are mutually separated according to embodiment 2.

FIG. 14 is a cross sectional view depicting a state in which the glass substrate 500 with the gas block layer 13 is removed from the polyimide substrate 100. The mechanism is the same as explained in FIG. 10 of embodiment 1.

As described above, according to embodiment 2, a generation of the black substance 30 is avoided; and further, adhesive strength between polyimide substrate 100 and the multilayer film 20 can be made more stable.

Embodiment 3

Figure 15:
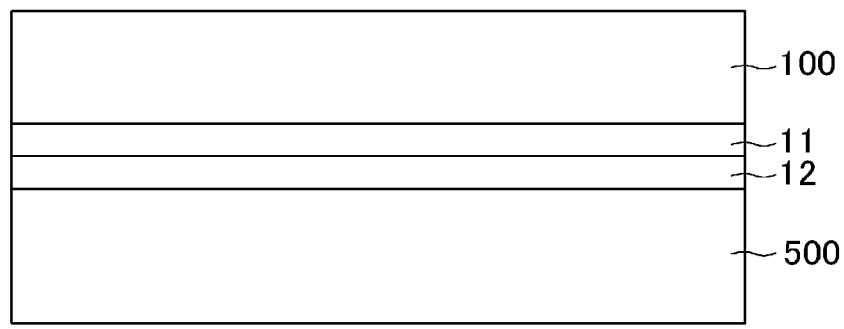
FIG. 15 is a cross sectional view of interface between the glass substrate and the polyimide substrate according to embodiment 3.

FIG. 15 is a cross sectional view of embodiment 3 according to the present invention. FIG. 15 differs from FIG. 8 of embodiment 1 in that the a-Si layer 12 and the glass substrate 500 directly contact each other in FIG. 15. The adhesive strength between the a-Si layer 12 and glass substrate 500 is less than the adhesive strength between the glass substrate 500 and the nitride layer such as the SiN layer, the TiN layer, or the AlO layer; however, it still has enough adhesive strength to enable the assembly of the glass substrate 500 and the polyimide substrate 100 to go through stably in the manufacturing process. A thickness of the a-Si layer 12 in FIG. 15 is e.g. 50 to 100 nm, which is a little bit thicker than the thickness of the a-Si layer 12 in FIG. 11 and so forth.

Figure 16:
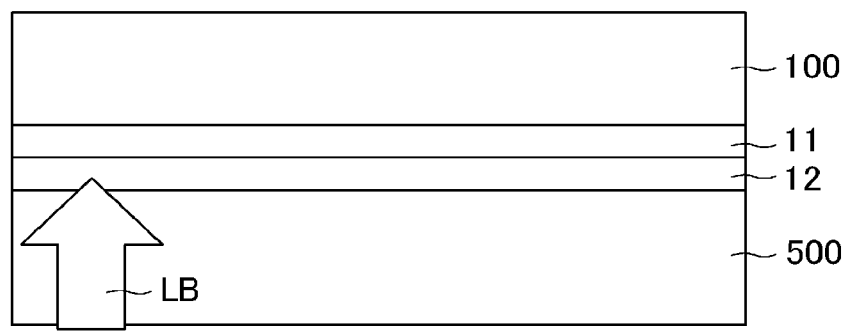
FIG. 16 is a cross sectional view depicting a state in which the a-Si layer is irradiated with the excimer laser according to embodiment 3.

FIG. 16 is a cross sectional view depicting a state in which the a-Si layer 12 in the structure of FIG. 15 is irradiated with the excimer laser LB for laser ablation. In FIG. 16, when the a-Si layer 12 is irradiated with the excimer laser LB, the a-Si layer 12 is heated up and melts. The heat generated in the a-Si layer 12 conducts to the glass substrate 500 directly and gases such as oxygen or hydrogen are generated. The a-Si layer 12 in embodiment 3, however, is thicker than the a-Si layer 12 in embodiment 1 or embodiment 2; thus, a blocking effect against the gases by the a-Si layer 12 is stronger in embodiment 3.

In addition, the gases, which are not blocked by the a-Si layer 12, is blocked by the adhesion layer 11, which is formed from nitride. Thus, a generation of black substance 30 at the interface of the polyimide substrate 100 due to gases such as oxygen or hydrogen generated in the glass substrate can be prevented.

Figure 17:
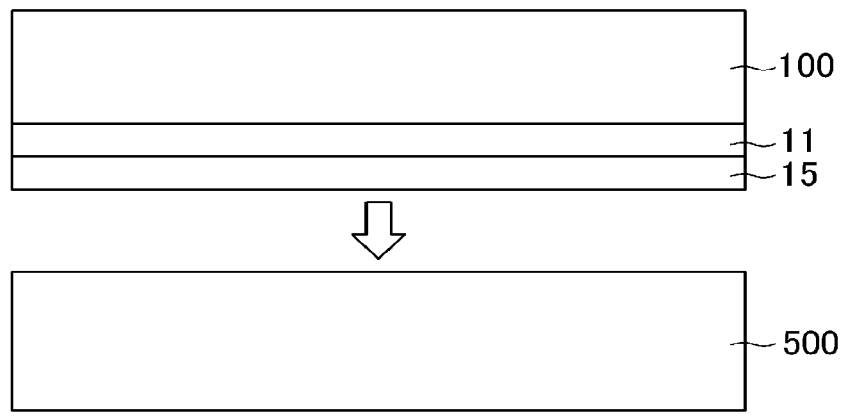
FIG. 17 is a cross sectional view depicting a state in which the glass substrate and the polyimide substrate are mutually separated according to embodiment 3.

FIG. 17 is a cross sectional view depicting a state in which the glass substrate 500 is separated from the polyimide substrate 100 after the laser ablation. The mechanism of separation between the glass substrate 500 and the polyimide substrate 100 is the same as explained in FIG. 10; however, the stress for the separation is generated between the poly-Si layer 15 and glass substrate 500 in FIG. 17. By the way, the adhesive strength between the a-Si layer 12 and the glass substrate 500 is less than the adhesive strength between the glass substrate 500 and the nitride layer 13 such as the SiN layer, the TiN layer, or the AlO layer; therefore, the separation between the glass substrate 500 and the a-Si layer 12 is easier in embodiment 3.

Embodiment 4

Figure 18:
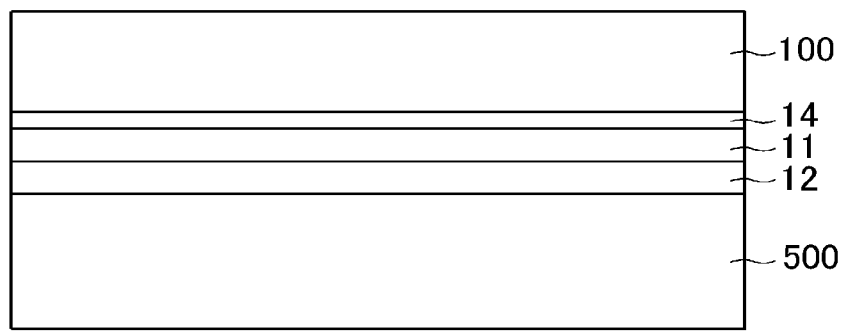
FIG. 18 is a cross sectional view of interface between the glass substrate and the polyimide substrate according to embodiment 4.

FIG. 18 is a cross sectional view of embodiment 4 of the present invention. FIG. 18 differs from FIG. 15 of embodiment 3 in that the AlO layer 14 is formed between the adhesion layer 11 and the polyimide substrate 100. A thickness, a role, and so forth of the AlO layer 14 is the same as explained in embodiment 2. Other structures of FIG. 18 are the same as FIG. 15.

Figure 19:
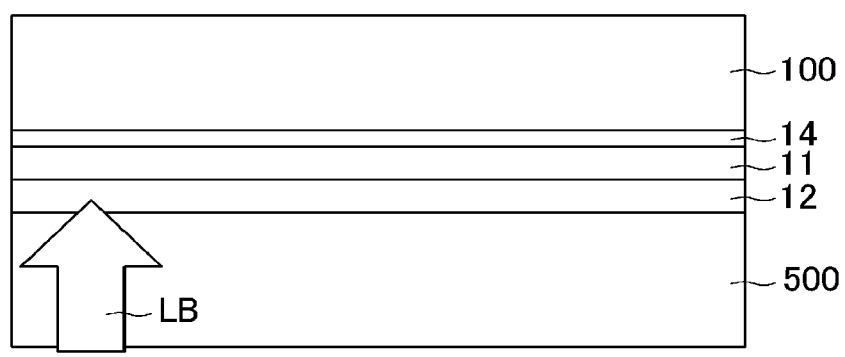
FIG. 19 is a cross sectional view depicting a state in which the a-Si layer is irradiated with the excimer laser according to embodiment 4.

FIG. 19 shows a state in which the a-Si layer 12 of FIG. 18 is irradiated with the excimer laser LB. The effect in FIG. 19 is the same as explained in FIG. 16 of embodiment 3.

Figure 20:
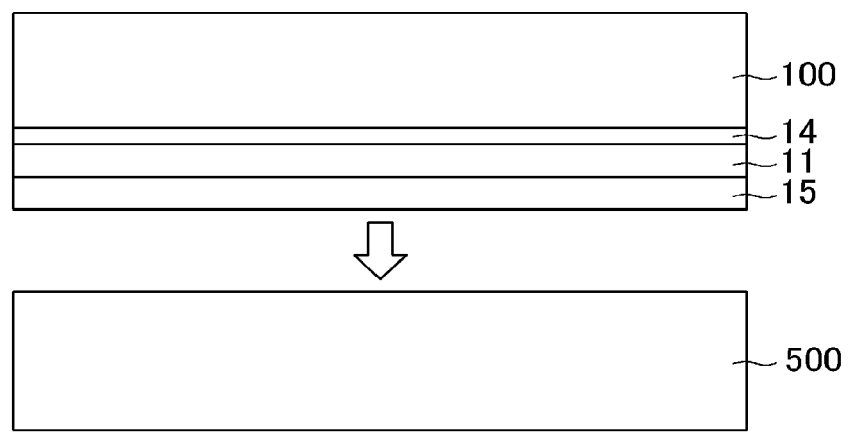
FIG. 20 is a cross sectional view depicting a state in which the glass substrate and the polyimide substrate are mutually separated according to embodiment 4.

FIG. 20 is a cross sectional view depicting a state in which the glass substrate 500 is separated from the polyimide substrate 100 by laser ablation. The process of separation between the glass substrate 500 and the polyimide substrate 100 in FIG. 20 is the same as the process of separation in FIG. 17 of embodiment 3.

Embodiment 5

In embodiments 1 through 4, the separation process of the glass substrate 500 and the TFT substrate 100 utilizes a stress generated during the a-Si layer 12 liquidizes and then crystalizes. In contrast, embodiment 5, for separation of the TFT substrate 100 from the glass substrate 500, utilizes a stress generated between the thermal expansion layer and the non-thermal expansion layer by heating the thermal expansion layer, which is the photo-heat conversion layer.

Figure 21:
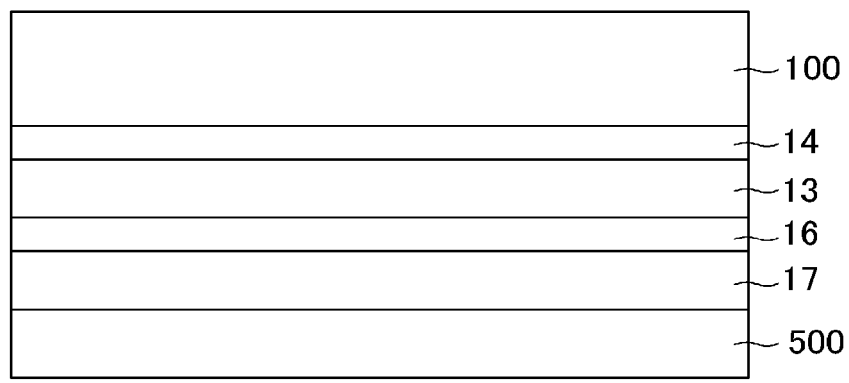
FIG. 21 is a cross sectional view of interface between the glass substrate and the polyimide substrate according to embodiment 5.

FIG. 21 is a cross sectional view of the multilayer film between the glass substrate 500 and the TFT substrate 100. In FIG. 21, from the side of glass substrate 500, the following layers are formed: the thermal expansion layer 17, which is the photo-heat conversion layer formed from metal (herein after the thermal expansion layer 17), the non-thermal expansion layer 16 formed from silicon oxide (herein after SiO) and so forth, the gas block layer 13 formed from nitride such as silicon nitride, and the AlO layer 14 for adhesion with the polyimide substrate 100.

Roles of each of the layers are as follows. The thermal expansion layer 17 expands by absorbing the laser beam LB and converts it to heat. Therefore, the thermal expansion layer 17 is formed from metal; among the metals, copper (Cu) is the most suitable. A thickness of the thermal expansion layer 17 should be thick enough to absorb the laser beam LB sufficiently. In addition, the thickness should be selected in a range between a condition in which the temperature of the expansion layer 17 rises rapidly by absorbing the laser beam LB and a condition in which the temperature of the expansion layer 17 rapidly descends after termination of irradiation of the laser beam LB. In the case of cupper, a thickness is preferably 100 nm to 200 nm. By the way, the temperature of the thermal expansion layer 17 rises up to 250 to 400 centigrade by laser irradiation.

The non-thermal expansion layer 16 does not expand even the thermal expansion layer 17 expands, thus, it has a role to generate a stress between the thermal expansion layer 17 and the non-thermal expansion layer 16. The non-thermal expansion layer 16 also has a role to prevent the heat from conducting to upper layer side than the non-thermal expansion layer 16, that is, to the polyimide substrate 100 even if the expansion layer 17 becomes high temperature. Therefore, the heat conductance of the non-thermal expansion layer 16 should be preferably low. The material of SiO is the most suitable for that purpose. A thickness of the SiO layer is preferably 50 to 100 nm.

When the thermal expansion layer 17 is made of cupper and the non-thermal expansion layer 16 is made of SiO, a thermal expansion coefficient of the thermal expansion layer 17 is $16.8 \times 10^{-6}$/centigrade and a thermal expansion coefficient of the non-thermal expansion layer 16 is $0.5 \times 10^{-6}$/centigrade. Therefore, provided the thermal expansion layer 17 is formed from Cu, and the non-thermal expansion layer 16 is formed from SiO, a big stress is generated between the thermal expansion layer 17 and the non-thermal expansion layer 16 when the thermal expansion layer 17 expands or shrinks.

When the temperature of the non-thermal expansion layer 16 formed from SiO is raised, there is a chance that gases such as oxygen and hydrogen are desorbed and the gases move to the polyimide substrate 100. Alternatively, gases adsorbed to the surface of the metal desorb and the gases move to the polyimide substrate 100. In such cases, the gases such as oxygen and hydrogen react with the polyimide and can make the soot like black substance 30 as explained in embodiment 1. The gas block layer 13, which is formed from nitride, has a role to prevent such gasses from moving to the polyimide substrate 100. A thickness of the gas block layer 13 in this case is 10 to 500 nm, and preferably, 100 to 200 nm.

The adhesive strength between the nitride and the polyimide is stable; however, in this embodiment, the AlO layer 14 is formed between the gas block layer 13, formed from nitride, and the polyimide substrate 100, thus, the adhesive strength between the polyimide substrate 100 and the multilayer film is further improved. The adhesive strength between the AlO film 14 and the polyimide substrate 100 is the same as explained in embodiment 2.

Figure 22:
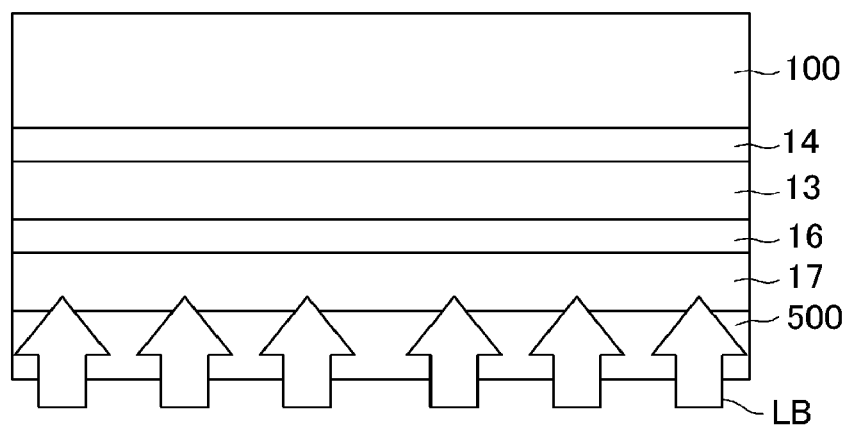
FIG. 22 is a cross sectional view depicting a state in which the thermal expansion layer is irradiated with the laser beam according to embodiment 5.

FIGS. 22 through 25 are cross sectional views that show mechanism of separation between the polyimide substrate 100 and the glass substrate 500. FIG. 22 is a cross sectional view depicting a state in which the thermal expansion layer 17 is irradiated with the laser beam LB from the side of the glass substrate 500. A thickness of the cupper that constitutes the thermal expansion layer 17 is 100 nm; thus, most of the laser beam LB is absorbed by the thermal expansion layer 17 and is converted to heat. The wavelengths of the laser have peaks at e.g. 308 nm, 355 nm, or 532 nm; the energy density of the laser is approximately 120 to 255 mJ/cm$^2$.

Figure 26:
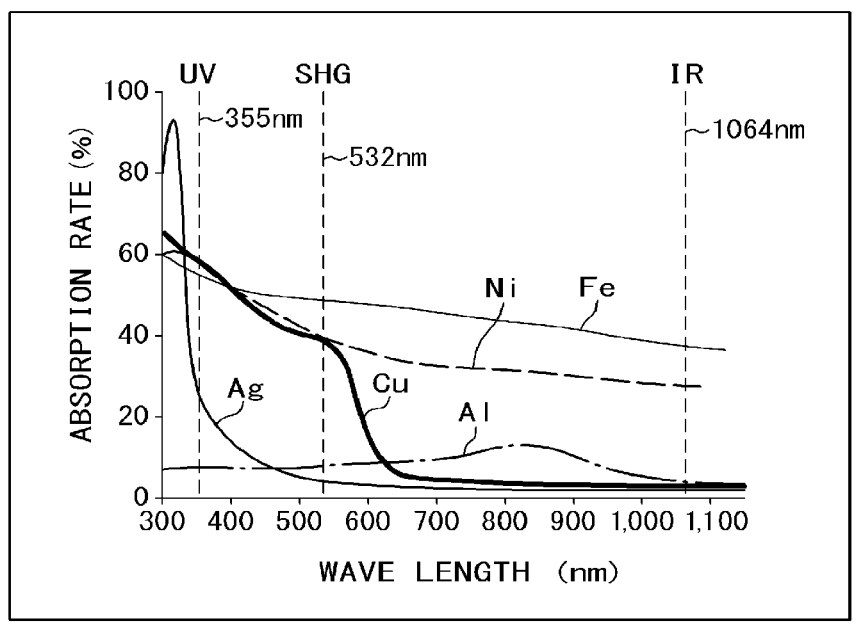
FIG. 26 is a graph that shows absorption rate in various metals with respect to the wave length.
Figure 27:
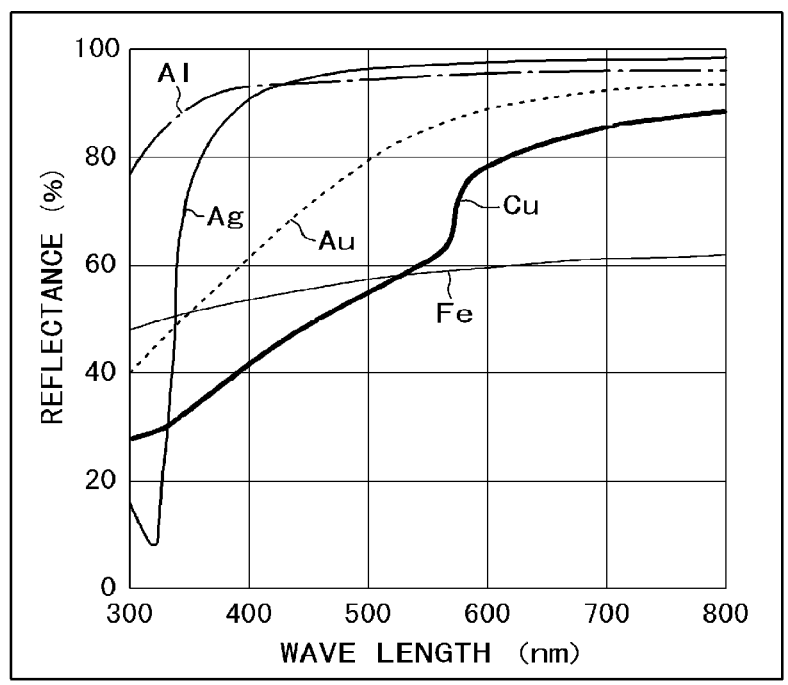
FIG. 27 is a graph that shows reflection rate in various metals with respect to the wave length.

FIG. 26 is a graph that shows absorption rate of the various metals when a thickness is 100 nm. FIG. 27 is a graph that shows reflection rate of the various metals when a thickness is 100 nm. When a thickness is approximately 100 nm, those metals absorb or reflect approximately all the laser beam LB; therefore, the relation between the absorption rate of FIG. 26 and the reflection rate of FIG. 27 has approximately the following relation: the absorption rate+ the reflection rate=1.

In FIG. 26, the abscissa is a wavelength (nm) of the laser beam; the ordinate is an absorption rate (%) when thickness of each of the metals is 100 nm. In FIG. 26, the wavelength 355 nm is ultra violet ray (UV); the wavelength 532 nm is green (the green laser SGH (Second Harmonic Generation), and the wavelength 1064 nm is infrared (IR). Iron and Nickle show a stable absorption rate to each of the wavelengths; Cupper shows a stable absorption rate from 300 nm to 532 nm (SHG).

FIG. 27 is a graph that shows a relation between the wavelength and the reflection rate of the various metals. Cupper shows low reflection rate in a wide range from 300 to 532 nm, which means cupper absorbs the laser energy efficiently in this region. Namely, considering FIGS. 26 and 27, when the laser beam that has a peak of 308 nm, 355 nm, or 532 nm is used, it can be understood that cupper can absorb the laser energy efficiently both from the view point of absorption and from the view point of reflection. In addition, cupper has a larger thermal expansion coefficient than iron and so forth. Therefore, cupper is suitable for the thermal expansion layer 17 in the present embodiment.

Figure 23:
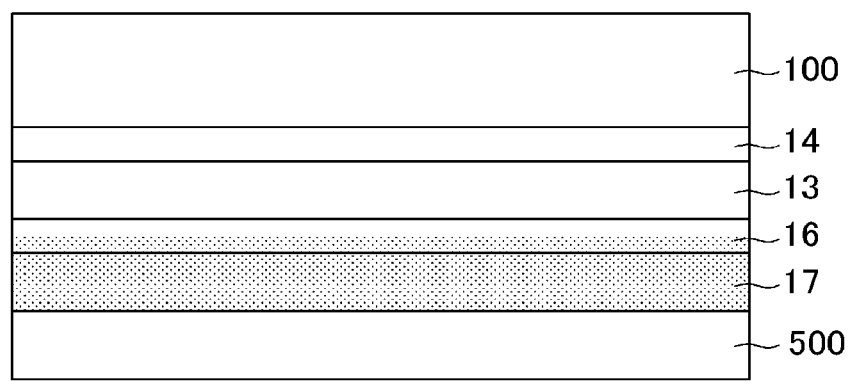
FIG. 23 is a cross sectional view depicting a state in which the thermal expansion layer is being heated by laser beam according to embodiment 5.

FIG. 23 is a cross sectional view depicting a state in which the thermal expansion layer 17 and the thermal expansion layer side of the non-thermal expansion layer 16 are heated by the laser beam LB. The dotted portion is a region that is heated by the laser beam LB in FIG. 23. The thermal expansion layer 17 is heated instantaneously by the laser beam LB; the heat conducts to the non-expansion layer 16 formed from SiO; however, since heat conductance of the SiO is low, the laser beam LB is switched off before the heat reaches the interface between the non-thermal expansion layer 16 and the gas block layer 13.

Figure 24:
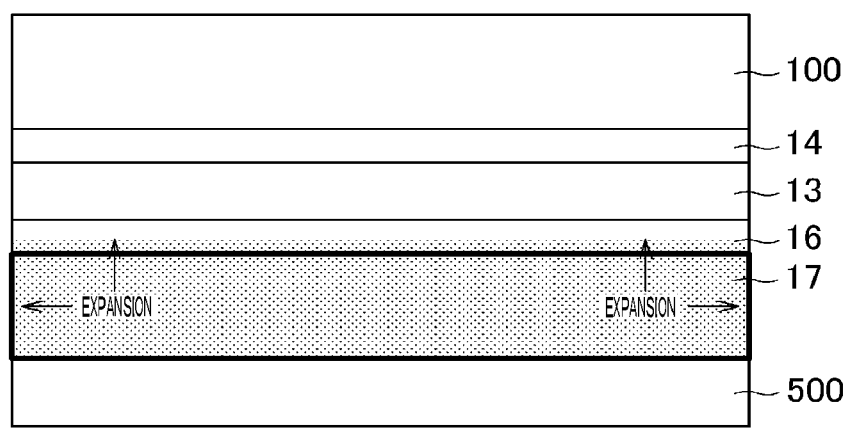
FIG. 24 is a cross sectional view depicting a state in which the thermal expansion layer is expanding according to embodiment 5.

FIG. 24 is a cross sectional view depicting a state in which the thermal expansion layer 17 is heated and expands. The expansion occurs both in a planer direction and in a thickness direction of the thermal expansion layer 17 as depicted by arrows in FIG. 24. On the other hand, a part of non-thermal expansion layer 16 is heated; however, the thermal expansion of the non-thermal expansion layer 16 is small. Therefore, a stress is generated between the thermal expansion layer 17 and the non-thermal expansion layer 16.

Figure 25:
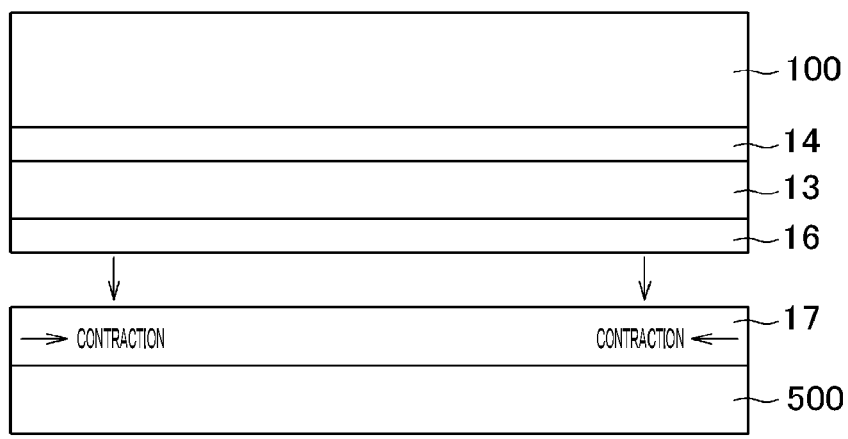
FIG. 25 is a cross sectional view depicting a state in which the glass substrate and the polyimide substrate are mutually separated according to embodiment 5.

FIG. 25 is a cross sectional view depicting a state in which the thermal expansion layer 17 and the non-thermal expansion layer 16 are mutually separated when the thermal expansion layer 17 shrinks after the laser irradiation is terminated. The thermal expansion layer 17 shrinks rapidly, however, the non-thermal expansion layer 16 does not shrink. Consequently, the stress, which is in reverse direction from the figure of 24, is generated between the thermal expansion layer 17 and the non-thermal expansion layer 16. Since the stresses in reverse directions are generated in a short period between the thermal expansion layer 17 and the non-thermal expansion layer 16, a separation occurs at the interface between the thermal expansion layer 17 and the non-thermal expansion layer 16; thus, the glass substrate 500 with thermal expansion layer 17 is separated from the TFT substrate 100 side.

As described in FIG. 25, the thermal expansion layer 17, with the glass substrate 500, is removed from the TFT substrate 100, thus, only the transparent films remain on the TFT substrate 100. Therefore, an operation of the liquid crystal display device, which has a back light, is not influenced.

Embodiment 6

Figure 28:
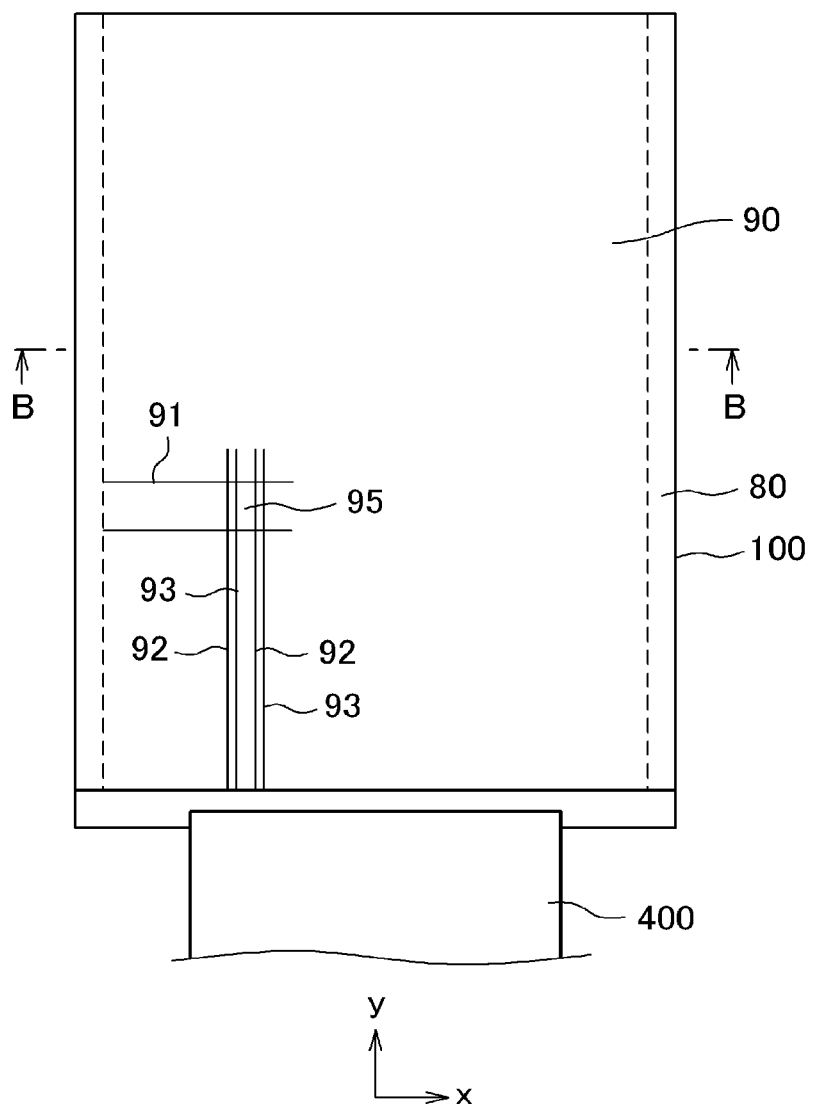
FIG. 28 is a plan view of the organic EL display device according to embodiment 6.

The present invention is applicable to an organic EL display device. The organic EL display device is easily realized as the flexible display device compared with the liquid crystal display device since it does not have a back light. FIG. 28 is a plan view of the organic EL display device, in which the present invention is applied. The organic EL display device according to the present invention is the display device that can be curved flexibly. The TFT substrate 100 is made of resin, on which the TFTs (Thin Film Transistor), scan signal lines, power lines, video signal lines, pixel electrodes, organic EL layers and so forth are formed.

In FIG. 28, the scan signal line driving circuits 80 are formed at both sides of the display area 90. In the display area 90, the scan signal lines 91 extend in lateral direction (x direction) and arranged in longitudinal direction (y direction). The video signal lines 92 and the power lines 93 extend in longitudinal direction and arranged in lateral direction. The pixel 95 is defined by the area surrounded by the scan signal lines 91 and the video signal lines 92 or the power lines 93. In the pixel 95, the driving transistor, the switching transistor, (each of them is formed by TFT), the organic EL layer that emits light, and so forth are formed.

Figure 29:
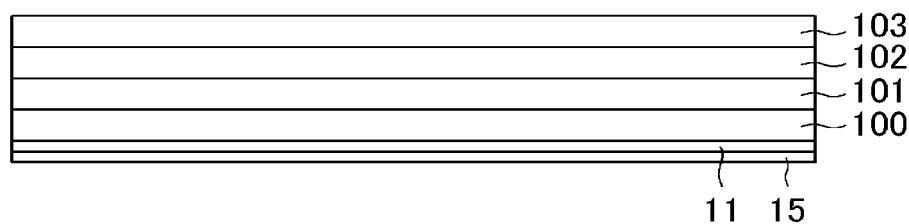
FIG. 29 is a cross sectional view along the line B-B of FIG. 28.

FIG. 29 is a cross sectional view along the line B-B of FIG. 28. In FIG. 29, the TFT substrate 100 is made of resin. Among resins, polyimide has excellent characteristics for the substrate of the display device because of its heat resistance, mechanical strength and so forth. However, the present invention is applicable even when the TFT substrate 100 is made of other resins. A thickness of the TFT substrate 100 is e.g. 10 to 20 microns.

The TFT wiring layer 101 is formed on the TFT substrate 100. The TFT wiring layer 101 includes: scan signal lines, video signal lines, power lines, organic EL layers, which emit light, anodes, which work as pixel electrodes, cathodes, which work as the common electrodes, and so forth. The protective layer 102 is formed covering the TFT wiring layer 101. The characteristics of the organic EL layer are deteriorated by moisture and so forth; the protective layer 102 prevents intrusion of moisture and so forth from the outside, and also mechanically protects the organic EL layer.

The circular polarizer 103 is disposed on the protective layer 102. The TFT wiring layer 101 has reflection electrodes, which reflect external light. The circular polarizer 103 prevents the reflection of external light; consequently, visibility of the screen is improved.

In FIG. 29, the adhesion layer 11 made of nitride such as SiN, TiN, and AlN is formed under the TFT substrate 100; the poly-Si layer 15, converted from the a-Si layer 12, is formed under the adhesion layer 11.

Figure 30:
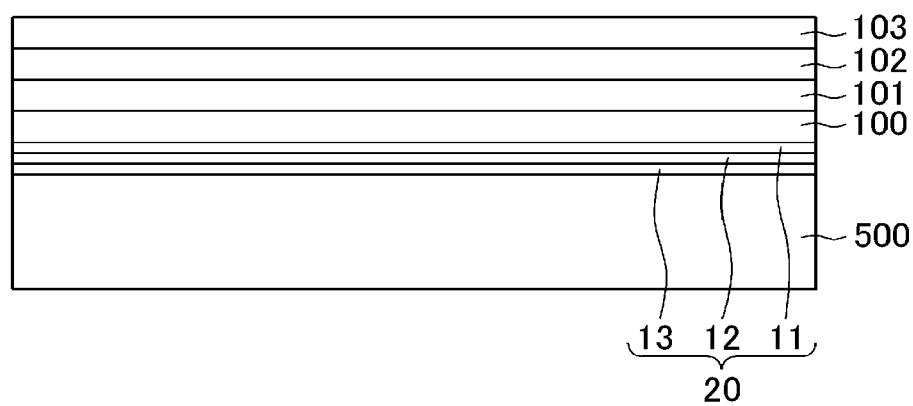
FIG. 30 is a cross sectional view that shows an interface between the glass substrate and the polyimide substrate according to embodiment 6.
Figure 31:
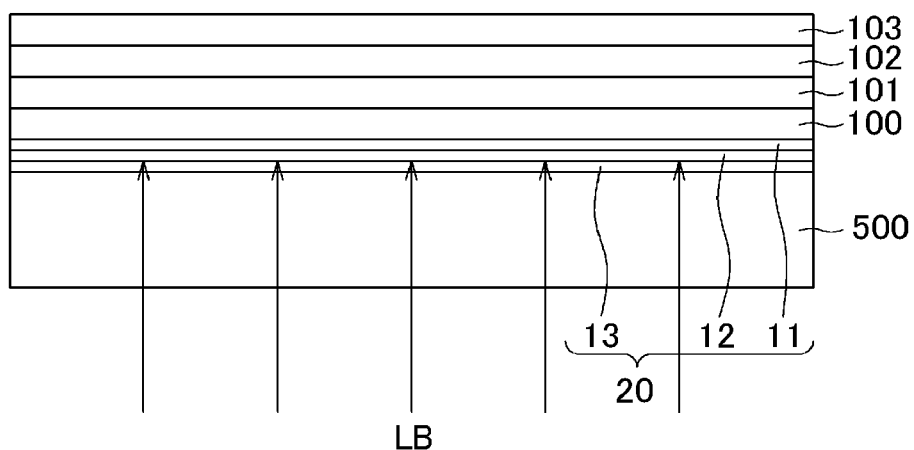
FIG. 31 is a cross sectional view depicting a state in which the a-Si layer is irradiated with the excimer laser according to embodiment 6.
Figure 32:
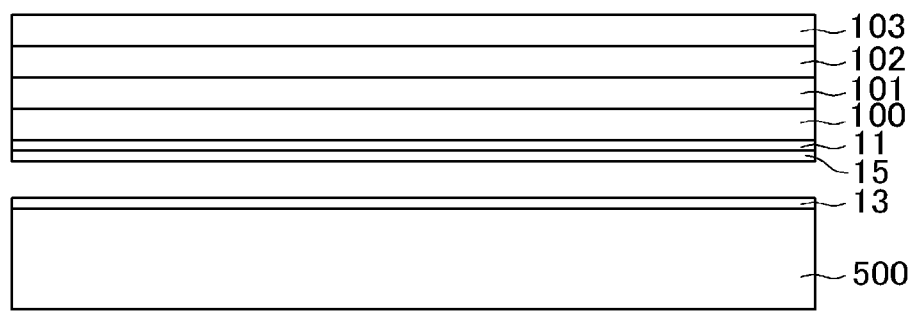
FIG. 32 is a cross sectional view depicting a state in which the glass substrate and the polyimide substrate are mutually separated according to embodiment 6.

FIGS. 30 to 32 are a cross sectional views that show interim structures in the manufacturing process for the structure of FIG. 29. In FIG. 30, the TFT substrate 100 is formed by polyimide on the glass substrate 500; however, in the present invention, the multilayer film 20 is formed on the glass substrate 500 before the TFT substrate 100 is formed. The multilayer film 20 is constituted by, in order from the glass substrate 500, the photo heat conversion layer 14, the thermal expansion layer 13, non-thermal expansion layer 12, and adhesion layer 11. Those layers are the same as explained in FIG. 8.

In FIG. 30, the polyimide substrate 100 is formed on the multilayer film 20. The polyimide substrate 100 is formed such that: the polyamic acid, which is precursor of polyimide, is coated by e.g. slit coater, and subsequently is baked. The TFT wiring layer 101, which constitutes the essential portion of the organic EL display device, is formed on the polyimide substrate 100. The structure of the TFT wiring layer 101 is the same as explained in FIG. 29. After that, the protective layer 102 is formed, and then, the circular polarizer 103 is adhered to the protective layer 102.

FIG. 31 is a cross sectional view depicting a state in which the a-Si layer 12 of FIG. 30 is irradiated with the excimer laser LB. The phenomenon appeared when the irradiation of the excimer laser LB is performed is the same as explained in FIG. 9 of embodiment 1.

FIG. 32 is a cross sectional view depicting a state in which the glass substrate 500 is separated from the TFT substrate 100 after the laser ablation. The mechanism for separation between the TFT substrate 100 and the glass substrate 500 is the same as explained in FIG. 10 of embodiment 1.

As described above, in the case of organic EL display device, too, as in the case of liquid crystal display device, a generation of the soot like black substance 30 can be avoided by forming multilayer film 20 between the TFT substrate 100 and the glass substrate 500. The structures of embodiments 2 to 4, which were explained in the liquid crystal display device, can be applied to the organic EL display device as the same to the liquid crystal display device. Further, as explained in embodiment 5, instead of using the a-Si film, the method that uses the thermal expansion layer 17 of the metal film formed from e.g. Cu can be used to separate the glass substrate 500 from the TFT substrate 100 in the organic EL display device.

There are the top emission type organic EL display device, in which displays are formed at top side of the TFT substrate 100, and the bottom emission type organic EL display device, in which displays are formed at bottom side of the TFT substrate 100. The structure of the present embodiment can be applied to both the top emission type organic EL display device and the bottom emission type organic EL display device.

Embodiment 7

Embodiment 7 is a variation of embodiment 5, and is especially useful for the organic EL display device. Embodiment 7 differs from embodiment 5 in that the non-thermal expansion layer 16 is formed on the glass substrate 500; the thermal expansion layer 17 is formed on it. Namely, the thermal expansion layer 17, which is formed from metal, remains on the TFT substrate 100 after the glass substrate 500 is removed from the TFT substrate 100; therefore, this structure is difficult to apply to the transparent mode liquid crystal display device. This structure, however, is very useful to the top emission type organic EL display device.

Figure 33:
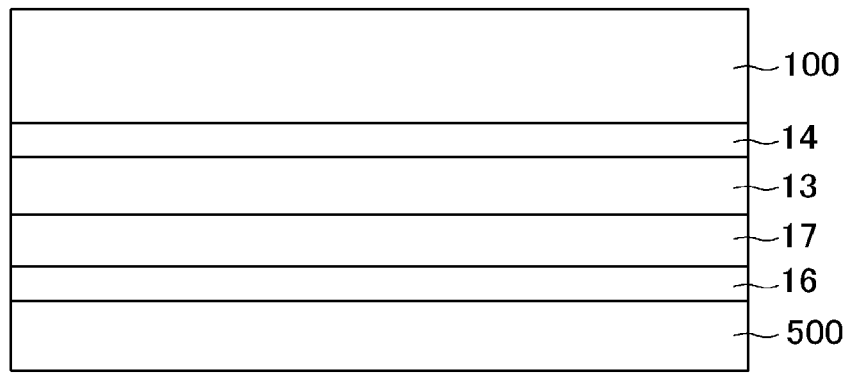
FIG. 33 is a cross sectional view that shows an interface between the glass substrate and the polyimide substrate according to embodiment 7.

FIG. 33 is a cross sectional view that shows the structure of multilayer film formed at the interface between the glass substrate 500 and the TFT substrate 100 formed from polyimide. FIG. 33 differs from FIG. 21 in that the non-thermal expansion layer 16 formed from SiO and so forth is formed on the glass substrate 500; the photo-heat conversion/thermal expansion layer (herein after thermal expansion layer 17) formed from metal as e.g. cupper is formed on the non-thermal expansion layer 16. Other structure of FIG. 33 is the same as the structure of FIG. 21. The thicknesses, functions and so forth of other layers are also the same as the structure of FIG. 21.

Figure 34:
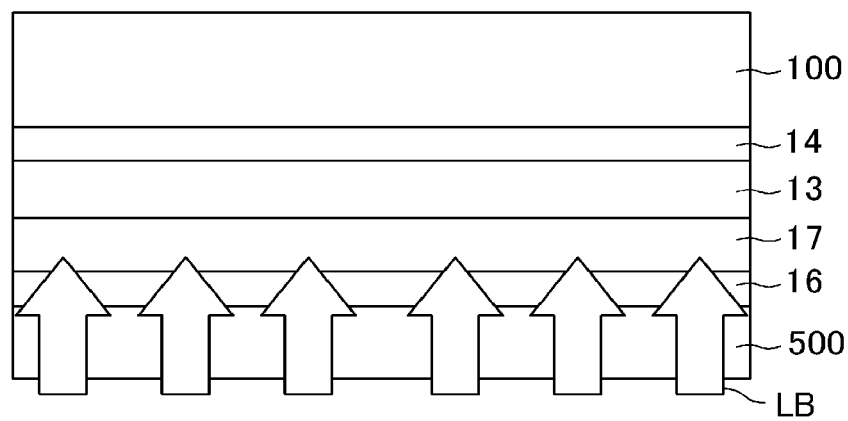
FIG. 34 is a cross sectional view depicting a state in which the thermal expansion layer is irradiated with the laser beam according to embodiment 7.
Figure 35:
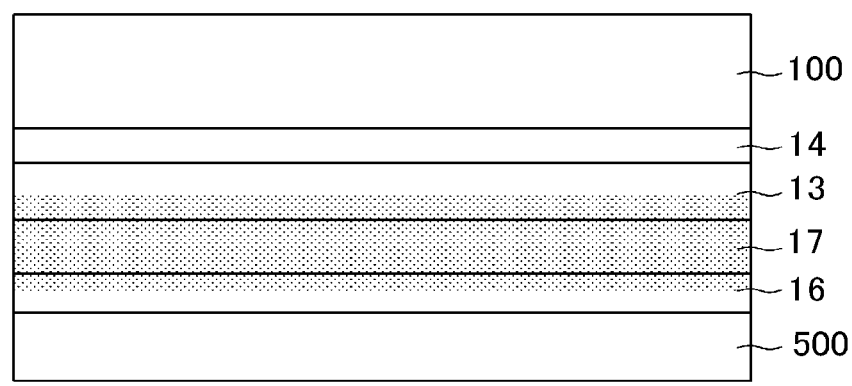
FIG. 35 is a cross sectional view depicting a state in which the thermal expansion layer is being heated by laser beam according to embodiment 7.

FIGS. 34 through 37 are cross sectional views that explain the separation mechanism between the TFT substrate 100 and the glass substrate 500 in embodiment 7. FIG. 34 is a cross sectional view depicting a state in which the thermal expansion layer 17 is irradiated with the laser beam LB from the side of the glass substrate 500. The laser beam LB is focused on the thermal expansion layer 17. When the thermal expansion layer 17 is heated by the laser beam LB, the heat conducts to the non-thermal expansion layer 16 and the gas block layer 13. The dotted area in FIG. 35 is an area that is heated by the heat conductance.

Figure 36:
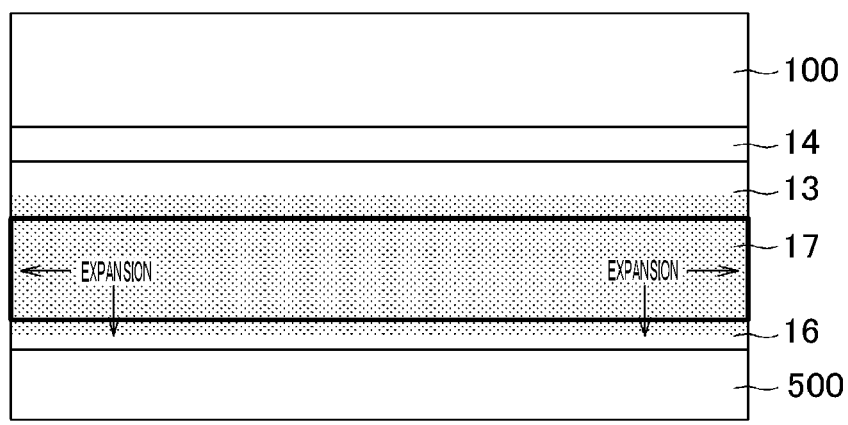
FIG. 36 is a cross sectional view depicting a state in which the thermal expansion layer is expanding according to embodiment 7.

FIG. 36 is a cross sectional view depicting a state in which the thermal expansion layer 17 is expanding by heat. Thermal expansion coefficient of non-thermal expansion layer 16 formed from SiO is small compared with that of the gas block layer 13 formed from nitride. Therefore, the stress at the interface between the thermal expansion layer 17 and the non-thermal expansion layer 16 is bigger than the stress at the interface between the thermal expansion layer 17 and the gas block layer 13.

Figure 37:
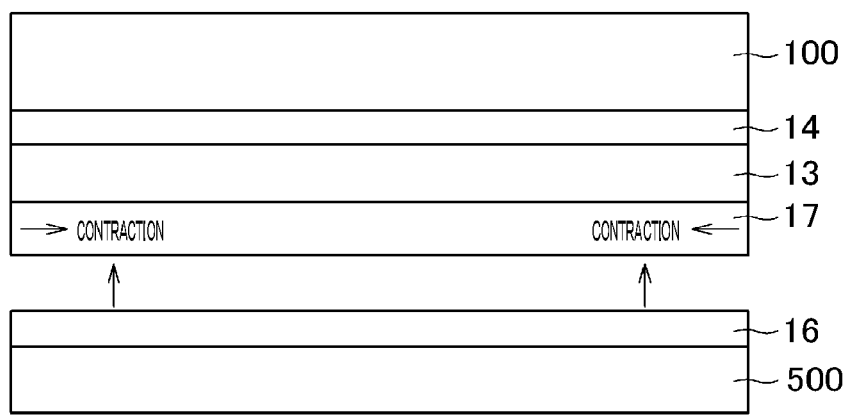
FIG. 37 is a cross sectional view depicting a state in which the glass substrate and the polyimide substrate are mutually separated according to embodiment 7.

In FIG. 37, the thermal expansion layer 17 shrinks rapidly after the irradiation of the laser beam LB is terminated, consequently, the stress, which is in reverse direction from the stress generated when the thermal expansion layer 17 expands, is generated between the thermal expansion layer 17 and the non-thermal expansion layer 16, and between the thermal expansion layer 17 and the gas block layer 13. The stress when the thermal expansion layer 17 shrinks is bigger at the interface between the thermal expansion layer 17 and the non-thermal expansion layer 16 than that at the interface between the thermal expansion layer 17 and the gas block layer 13; therefore, a separation occurs at the interface between the thermal expansion layer 16 and the non-thermal expansion layer 17; thus, the TFT substrate 100 and the glass substrate 500 are mutually separated.

After the separation, the thermal expansion layer 17 formed from metal of e.g. cupper remains on the TFT substrate 100 and SiO film remains on the glass substrate 500. The metal is opaque when its thickness is approximately 100 nm; therefore, present invention is difficult to apply to the liquid crystal display device, which has a back light. Therefore, embodiment is specifically useful for the organic EL display device. On the other hand, the present invention can be applied to the reflection mode liquid crystal display device.

What is claimed is:

1. A display device having pixels formed on a first surface of a resin substrate comprising:
    a first layer, formed from nitride, being formed on a second surface of the resin substrate, the second surface being an opposite surface to the first surface,
    wherein a TFT circuit layer is arranged on the first surface,
    the TFT circuit layer includes scan signal lines, video signal lines, thin film transistors, and the pixels,
    a second layer, which is a separation layer, is formed on the first layer,
    the first layer is located between the resin substrate and the second layer,
    the first layer of nitride is an adhesion layer, and is formed from SiN, TiN, or AlN, and
    the second layer is a poly-Si layer.

2. The display device according to claim 1,
    wherein, the first layer of nitride is formed from SiN.

3. The display device according to claim 1,
    wherein, the separation layer includes a poly-Si layer converted from an a-Si layer.

4. The display device according to claim 1,
wherein, a thickness of the first layer is larger than a thickness of the second layer.

\* \* \* \* \*